US009848703B2

(12) United States Patent
Chen et al.

(10) Patent No.: US 9,848,703 B2
(45) Date of Patent: Dec. 26, 2017

(54) SLIDE RAIL ASSEMBLY

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chien-Li Huang, Kaohsiung (TW); Chun-Yi Ho, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 103 days.

(21) Appl. No.: 14/813,331

(22) Filed: Jul. 30, 2015

(65) Prior Publication Data
US 2016/0262540 A1 Sep. 15, 2016

(30) Foreign Application Priority Data
Mar. 12, 2015 (TW) .............................. 104108021 A

(51) Int. Cl.
*A47B 81/00* (2006.01)
*A47B 97/00* (2006.01)
*A47B 96/07* (2006.01)
*H05K 7/14* (2006.01)
*A47B 96/06* (2006.01)

(52) U.S. Cl.
CPC ............ *A47B 96/07* (2013.01); *A47B 96/067* (2013.01); *H05K 7/1489* (2013.01)

(58) Field of Classification Search
CPC . G06F 1/18; G06F 1/183; G06F 1/187; G06F 1/188; H05K 7/14; H05K 7/1401; H05K 7/1411; H05K 7/1474; H05K 7/1485; H05K 7/1488; H05K 7/1489; H05K 7/1494; H05K 7/18; H05K 7/183; H05K 5/02; H05K 5/0217
USPC ....................... 361/724–727, 679.37–679.39; 312/223.1–223.3; 248/298.1
See application file for complete search history.

(56) References Cited

U.S. PATENT DOCUMENTS

| 6,424,534 | B1* | 7/2002 | Mayer ..................... G06F 1/181 312/223.1 |
| 6,601,713 | B2 | 8/2003 | Kaminski |
| 6,644,481 | B2 | 11/2003 | Dean et al. |
| 6,685,033 | B1 | 2/2004 | Baddour et al. |
| 6,702,124 | B2 | 3/2004 | Lauchner et al. |
| 7,187,554 | B2* | 3/2007 | Seki .................... A47B 21/0314 361/727 |
| 7,281,694 | B2* | 10/2007 | Allen ................... A47B 96/068 211/183 |
| 7,318,532 | B1* | 1/2008 | Lee ...................... H05K 7/1405 211/26 |

(Continued)

*Primary Examiner* — Terrell McKinnon
*Assistant Examiner* — Michael McDuffie
(74) *Attorney, Agent, or Firm* — Rosenberg, Klein & Lee

(57) ABSTRACT

A slide rail assembly to be mounted to a first post and a second post of a rack is provided. The two posts define an accommodation space therebetween. The slide rail assembly is mounted between the first post and the second post by two brackets and includes a transverse width. A portion of the transverse width is arranged within the accommodation space so as to provide more space and thereby facilitate the mounting of an object to the rack.

13 Claims, 14 Drawing Sheets

(56) References Cited

U.S. PATENT DOCUMENTS

| | | | | |
|---|---|---|---|---|
| 7,400,509 | B2* | 7/2008 | Hidaka | H05K 7/1489 |
| | | | | 211/26 |
| 8,226,181 | B2* | 7/2012 | Du | H05K 7/1489 |
| | | | | 211/26 |
| 8,534,775 | B1* | 9/2013 | Liang | H05K 7/1489 |
| | | | | 312/223.1 |
| 2003/0141791 | A1* | 7/2003 | Dubon | H05K 7/1489 |
| | | | | 312/333 |
| 2004/0120123 | A1* | 6/2004 | Mayer | H05K 7/1489 |
| | | | | 361/725 |
| 2004/0233643 | A1* | 11/2004 | Bolich | H05K 7/1489 |
| | | | | 361/727 |
| 2005/0068745 | A1* | 3/2005 | Hartman | H05K 7/16 |
| | | | | 361/726 |
| 2006/0152115 | A1 | 7/2006 | Dubon et al. | |
| 2008/0144293 | A1* | 6/2008 | Aksamit | H05K 7/1489 |
| | | | | 361/727 |
| 2009/0219701 | A1* | 9/2009 | Wu | H05K 7/1494 |
| | | | | 361/727 |
| 2010/0008608 | A1* | 1/2010 | Chen | A47B 88/487 |
| | | | | 384/45 |
| 2010/0226083 | A1* | 9/2010 | Wang | H05K 7/1489 |
| | | | | 361/679.02 |
| 2011/0091141 | A1* | 4/2011 | Liang | H05K 7/1489 |
| | | | | 384/20 |
| 2012/0087604 | A1* | 4/2012 | Yu | H05K 7/1489 |
| | | | | 384/18 |
| 2013/0259411 | A1* | 10/2013 | Judge | F16C 29/04 |
| | | | | 384/49 |

* cited by examiner

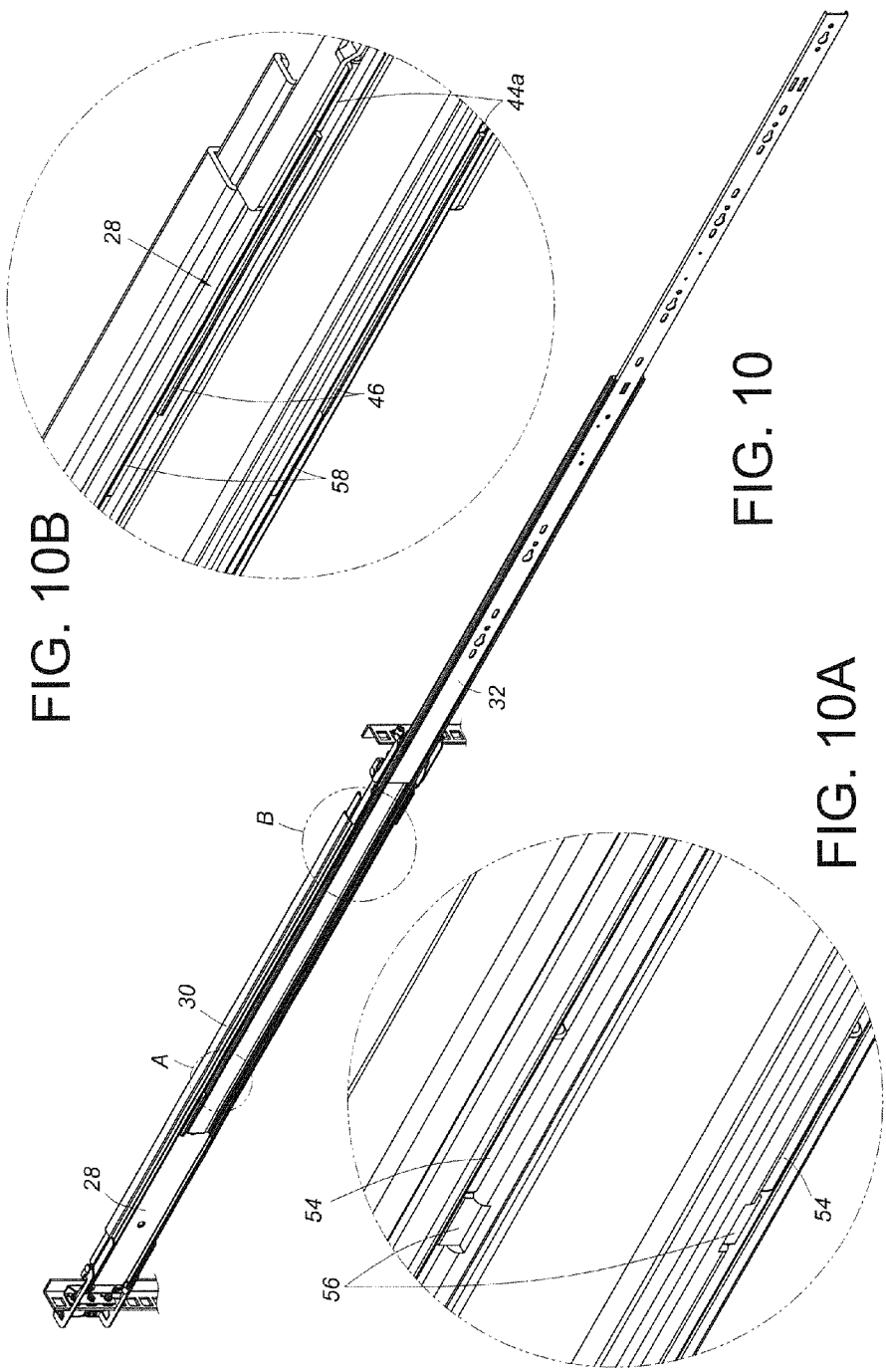

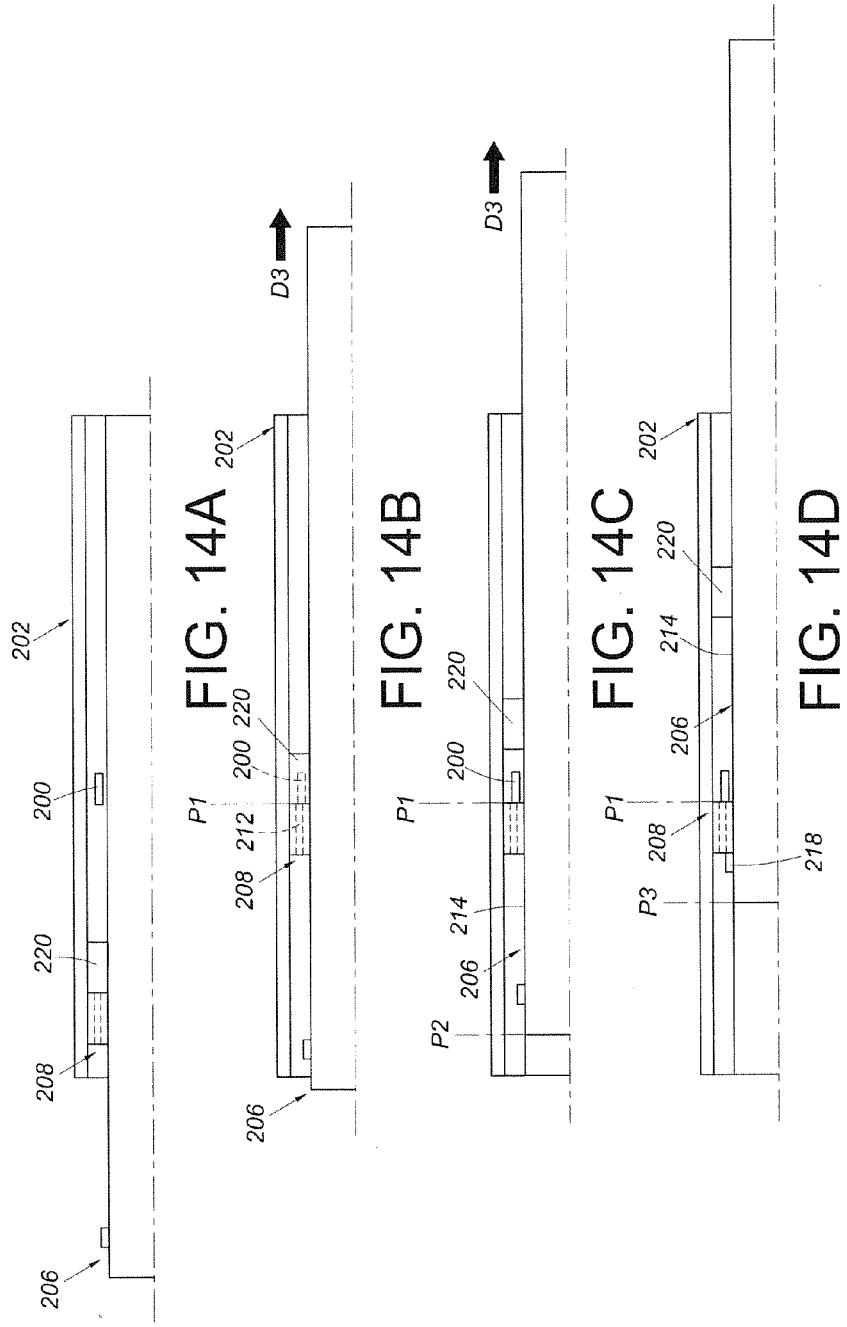

US 9,848,703 B2
SLIDE RAIL ASSEMBLY

FIELD OF THE INVENTION

The present invention relates to a slide rail assembly. More particularly, the present invention relates to a slide rail assembly which, when mounted on two posts, has a portion of its transverse width arranged within an accommodation space between the two posts, and which is well supported in an extended state as well as in a retracted state.

BACKGROUND OF THE INVENTION

Referring to FIG. 1 for a server system in which an object 100 is mounted on a rack 104, the object 100 has two corresponding lateral sides (only one of which is shown in FIG. 1 for the sake of simplicity) each mounted to a pair of posts of the rack 104 by a slide rail assembly 102. Each pair of posts include a first post 106a and a second post 106b and are spaced apart. The slide rail assembly 102 includes a first rail 108, a second rail 112, and a third rail 114. The first rail 108 is mounted to the first post 106a and the second post 106b by a pair of brackets 110. The second rail 112 is longitudinally movably connected to the first rail 108 while the third rail 114 is longitudinally movably connected to the second rail 112. Each of the second rail 112 and the third rail 114 can be longitudinally displaced relative to the first rail 108 in order for the object 100 to be pulled out of the rack 104 via the third rail 114.

More specifically, the foregoing pair of posts and the pair of posts that are not shown in FIG. 1 define a first transverse width W10 therebetween, and this width is generally fixed. On the other hand, the object 100 includes a second transverse width W12, and the cross section of each slide rail assembly 102 includes a third transverse width W14. The object 100 can fit within the first transverse width W10 between the two pairs of posts because the sum of the second transverse width W12 of the object 100 and the third transverse widths W14 of the pair of slide rail assemblies 102 equals the first transverse width W10. Since the first transverse width W10 is generally fixed and therefore poses a limitation in width, an object wider than the object 100 will have problem being mounted between the two pairs of posts.

SUMMARY OF THE INVENTION

According to one aspect of the present invention, a slide rail assembly to be mounted to a first post and a second post is provided, wherein the first post and the second post substantially correspond in position to each other and define an accommodation space therebetween. The slide rail assembly includes a first rail and a second rail. The first rail is mounted to the first post and the second post via a first bracket and a second bracket respectively such that the first rail is located between the first post and the second post, and preferably, one of the first bracket and the second bracket further includes a sidewall having at least one support portion for supporting the second rail when the second rail is displaced relative to the first rail to move past the at least one support portion. The first rail includes a longitudinal wall, an upper wall, and a lower wall, wherein the upper wall and the lower wall are connected to two corresponding sides of the longitudinal wall respectively. At least a portion of the longitudinal wall of the first rail is arranged within the accommodation space. The longitudinal wall, the upper wall, and the lower wall of the first rail jointly define a longitudinal channel. The second rail is longitudinally movably connected to the first rail and is located in the longitudinal channel of the first rail.

According to another aspect of the present invention, a slide rail assembly applicable to an object to be supported is provided. The object is to be mounted to a rack by a pair of such slide rail assemblies. The rack includes two pairs of posts which define a transverse width therebetween. Each pair of posts include a first post and a second post substantially corresponding in position to the first post. Each second post as well as each first post has a first side and a second side opposite the first side. An accommodation space is defined by each pair of posts as between a longitudinal extension between the two first sides and a longitudinal extension between the two second sides. Each slide rail assembly includes a first rail and a second rail. The first rail is mounted to the first post and the second post of the corresponding pair of posts via a first bracket and a second bracket respectively such that the first rail is located between the first post and the second post, and preferably, one of the first bracket and the second bracket further includes a sidewall having at least one support portion for supporting the second rail when the second rail is displaced relative to the first rail to move past the at least one support portion. The second rail is longitudinally movably connected to the first rail. Each slide rail assembly includes a transverse width, and a portion of the transverse width of each slide rail assembly is arranged within the accommodation space defined by the corresponding pair of posts and preferably includes at least a portion of the width of the longitudinal wall of the first rail.

According to yet another aspect of the present invention, a slide rail assembly includes a first rail and a second rail. The first rail includes a longitudinal wall, an upper wall, and a lower wall, wherein the upper wall and the lower wall are connected to two corresponding sides of the longitudinal wall respectively; and the longitudinal wall, the upper wall, and the lower wall jointly define a longitudinal channel. The second rail is longitudinally movably connected to the first rail and is located in the longitudinal channel of the first rail.

In some embodiments of any of the foregoing aspects, one of the upper wall and the lower wall of the first rail is further provided with a front blocking portion and a rear blocking portion, and the slide rail assembly further includes at least one slide facilitating member mounted between the front blocking portion and the rear blocking portion to facilitate displacement of the second rail relative to the first rail.

In some embodiments of any of the foregoing aspects, the first rail has a first length, and the second rail has a second length greater than the first length of the first rail.

In some embodiments of any of the foregoing aspects, the slide rail assembly further includes a third rail longitudinally movably connected to the second rail and configured to be mounted with the object, wherein the third rail has a third length which is preferably greater than the first length of the first rail.

In some embodiments of any of the foregoing aspects, the second rail further includes a longitudinal wall, an upper wall, and a lower wall, wherein the upper wall and the lower wall are connected to two corresponding sides of the longitudinal wall respectively, and the slide rail assembly further includes at least one pair of support members mounted between the first rail and the second rail in order to support the upper wall and the lower wall of a section of the second rail respectively when the second rail is displaced relative to the first rail.

Preferably, the slide rail assembly includes a pair of pressing portions provided at the upper wall and the lower wall of the second rail respectively so that, when the second rail is displaced relative to the first rail in an extension direction from a retracted position, the pair of pressing portions can drive the at least one pair of support members.

Preferably, the slide rail assembly further includes a pair of blocking portions provided at the first rail so that, while the second rail is displaced relative to the first rail in the extension direction, the pair of blocking portions can block the at least one pair of support members and thereby keep the at least one pair of support members at a predetermined position.

Preferably, each aforesaid support member includes a longitudinal portion and a contact portion transversely connected to the longitudinal portion, and each contact portion can be blocked by one of the pair of blocking portions.

Preferably, the slide rail assembly further includes at least another pair of support members respectively and fixedly connected to the upper wall and the lower wall of the second rail such that the upper wall and the lower wall of another section of the second rail are supported relative to the first rail.

One of the advantageous features of applying the present invention is that the slide rail assembly can be mounted to a pair of posts of a rack, and that a portion of the transverse width of the slide rail assembly is arranged within an accommodation space defined between the pair of posts so as to provide more space and thereby facilitate the mounting of an object to the rack.

Another one of the advantageous features of applying the present invention is that the slide rail assembly includes at least one pair of support members for supporting a rail of the slide rail assembly when the rail is displaced relative to another rail of the slide rail assembly.

BRIEF DESCRIPTION OF THE DRAWINGS

FIG. 10 is a perspective view of the slide rail assembly in FIG. 3 and shows the slide rail assembly mounted between a pair of posts, wherein both the second rail and the third rail are in an extended state relative to the first rail;

FIG. 10A is an enlarged view of the circled area A in FIG. 10, showing that a pair of pressing portions of the second rail of the slide rail assembly are in contact with a pair of support members respectively;

FIG. 10B is an enlarged view of the circled area B in FIG. 10, showing that the at least one slide facilitating member of the slide rail assembly is blocked by the at least one front blocking portion of the first rail;

FIG. 14A is a schematic drawing in which the second rail of the slide rail assembly in FIG. 12 is in a retracted state relative to the first rail;

FIG. 14B is a schematic drawing in which the second rail of the slide rail assembly in FIG. 14A is displaced relative to the first rail in an extension direction, in which at least two sections of the second rail are supported by different pairs of support members respectively, and in which one pair of support members are blocked at a predetermined position by the blocking portions;

FIG. 14C is a schematic drawing in which the second rail in FIG. 14B is further displaced relative to the first rail in the extension direction; and FIG. 14D is a schematic drawing in which the second rail in FIG. 14C is further displaced relative to the first rail in the extension direction.

DETAILED DESCRIPTION OF THE INVENTION

Figure 1:
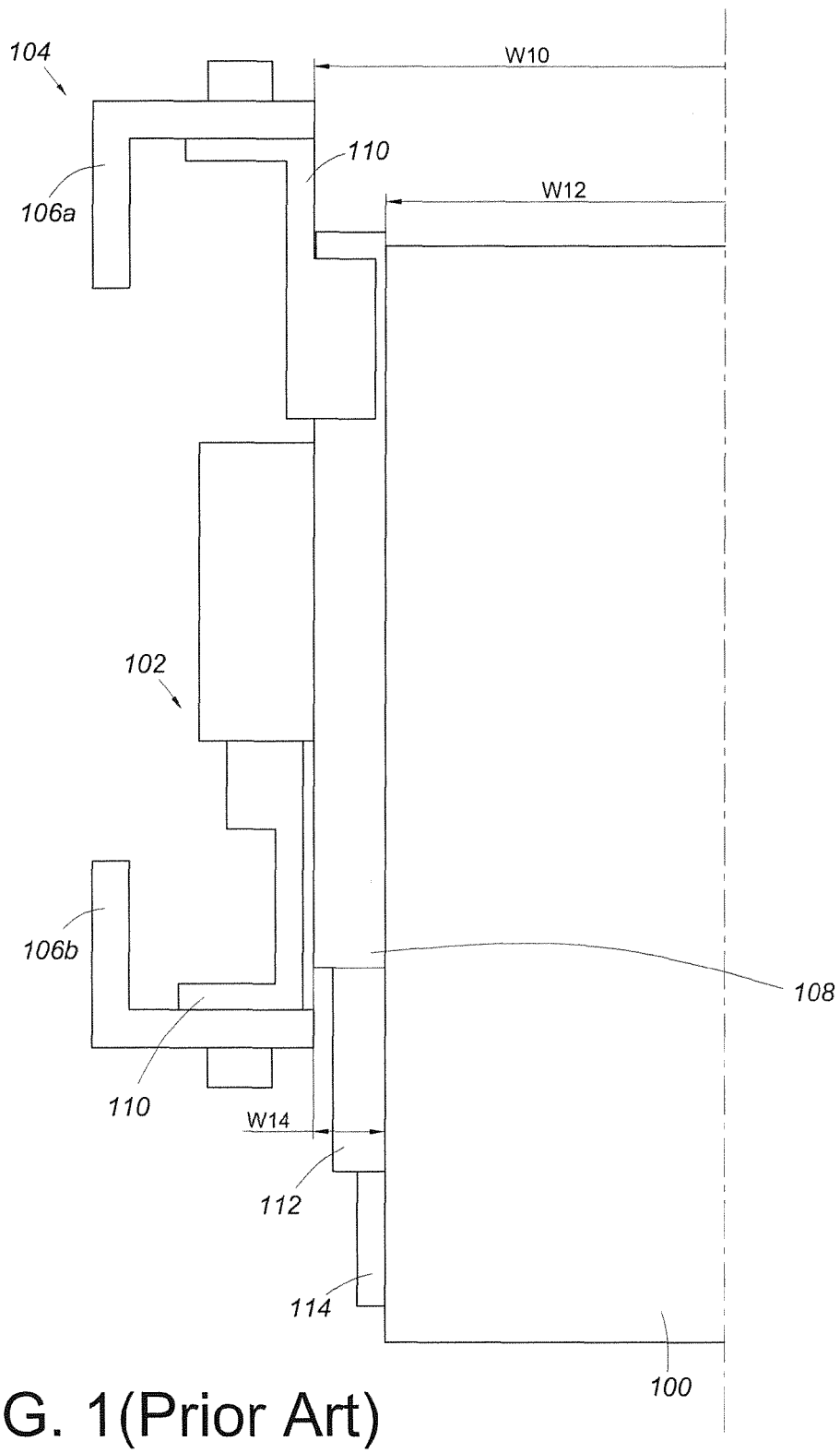
FIG. 1 schematically shows how a conventional slide rail assembly is used to mount an object to a pair of posts of a rack.
Figure 2:
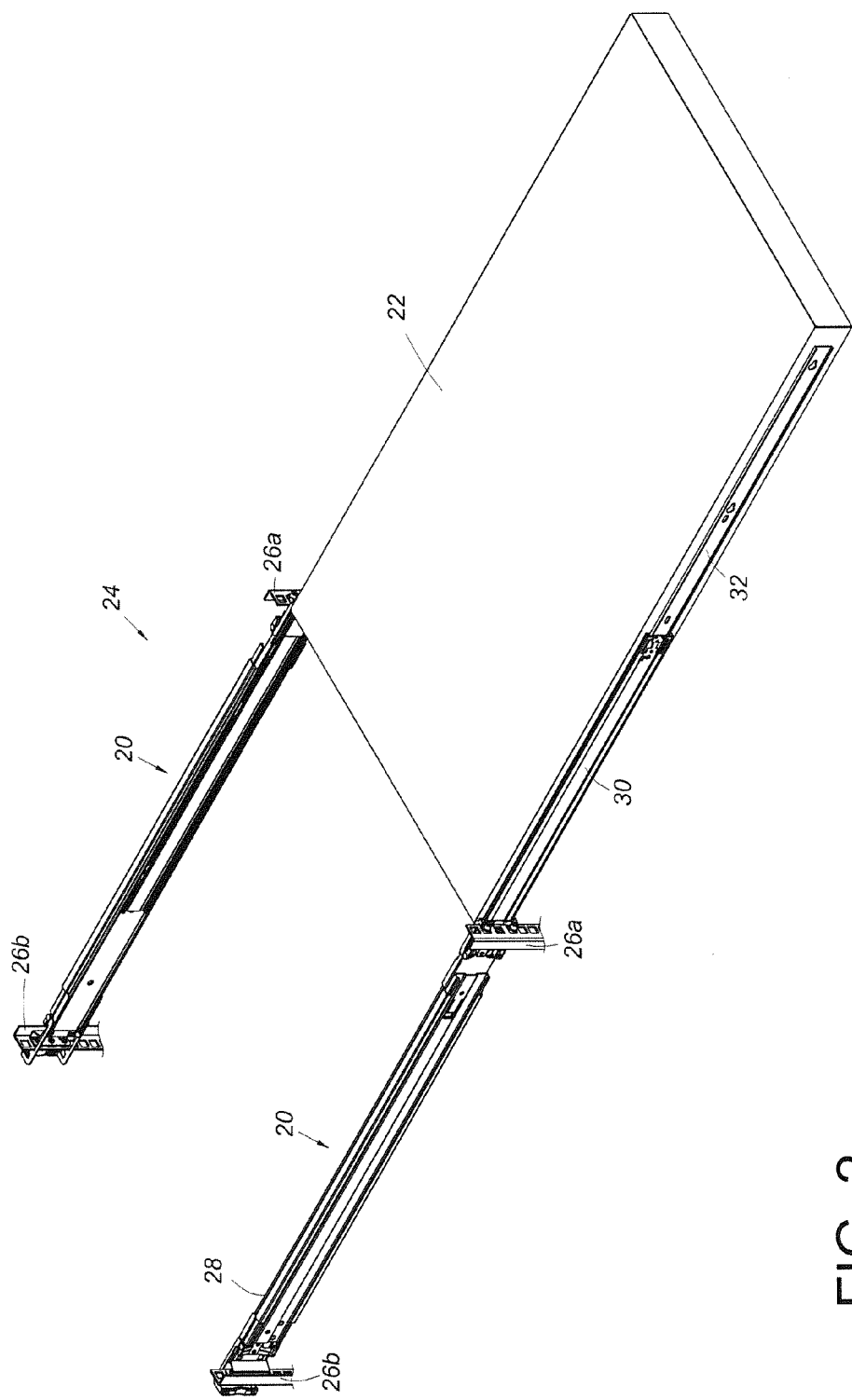
FIG. 2 is a perspective view showing how the slide rail assembly in an embodiment of the present invention is used in pairs to mount an object to a rack, wherein the slide rail assemblies are in an extended state.

Referring to FIG. 2, the slide rail assembly 20 in an embodiment of the present invention is applied in pairs to an object 22. The object 22 can be the chassis of a piece of electronic equipment or any other object to be supported; the present invention imposes no limitations in this regard. The object 22 is mounted to the two pairs of posts of a rack 24 by the two slide rail assemblies 20 respectively. For example, the object 22 has two corresponding lateral sides each mounted to one pair of posts by one slide rail assembly 20, wherein each pair of posts include a first post 26a and a second post 26b substantially corresponding in position to the first post 26a.

Each slide rail assembly 20 includes a first rail 28 and a second rail 30 longitudinally movably connected to the first rail 28. In this embodiment, each slide rail assembly 20 further includes a third rail 32 longitudinally movably connected to the second rail 30. The second rails 30 serve to increase the distance by which the third rails 32 can be displaced relative to the first rails 28. The third rails 32 are configured to connect with the two corresponding lateral sides of the object 22 respectively. More specifically, each second rail 30 and each third rail 32 can be displaced relative to the corresponding first rail 28 from a retracted position to an extended position, thereby bringing the slide rail assembly 20 into an extended state in which the object 22 is outside the rack 24.

Figure 3:
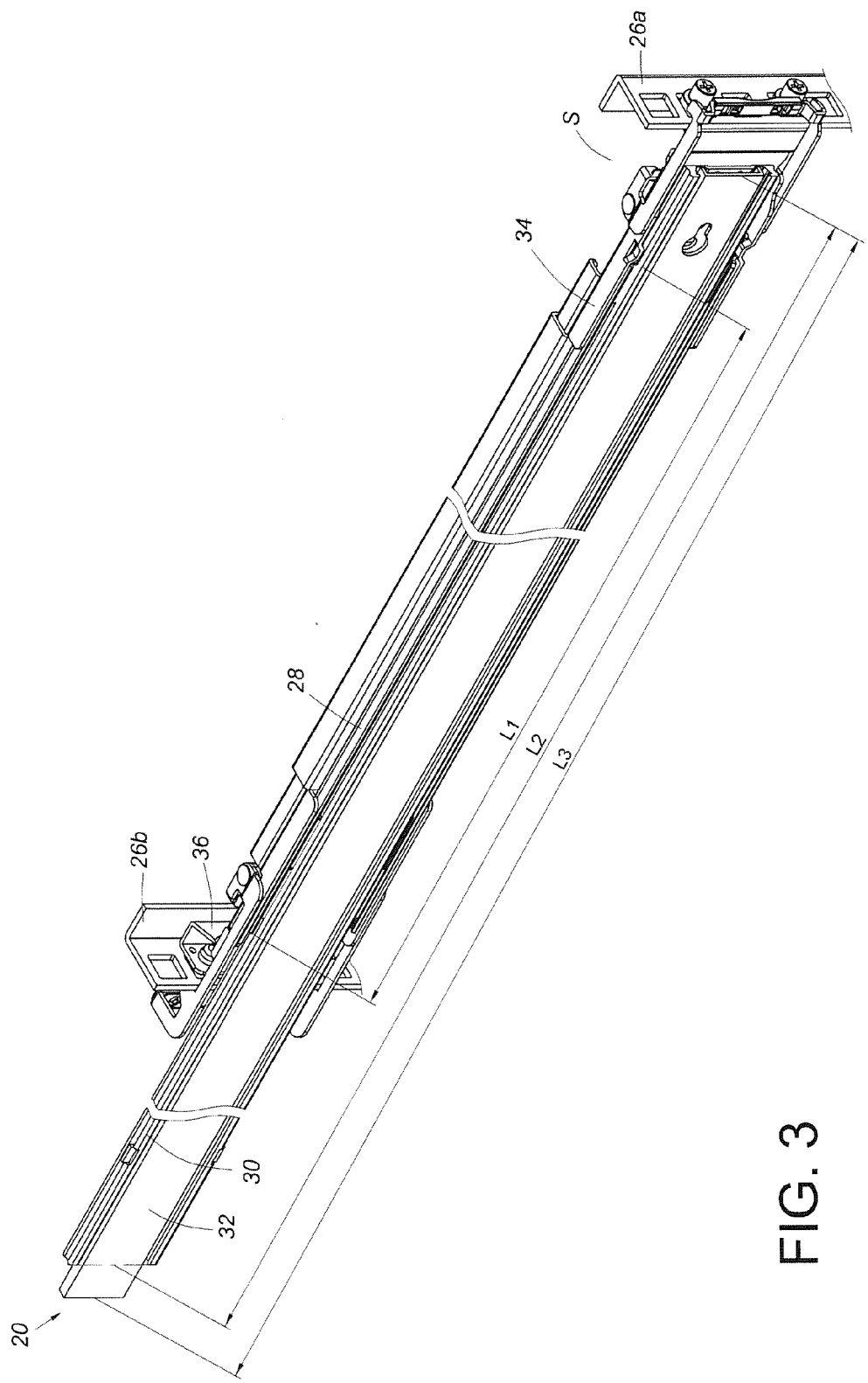
FIG. 3 is a perspective view showing one of slide rail assemblies in FIG. 2 mounted on a pair of posts, wherein the slide rail assembly is in a retracted state.

As shown in FIG. 3, the first rail 28, the second rail 30, and the third rail 32 of the slide rail assembly 20 can be brought into a retracted state. For example, the second rail 30 and the third rail 32 can be separately displaced relative to the first rail 28 from their respective extended positions into the retracted state. The first rail 28, the second rail 30, and the third rail 32 have lengths L1, L2, and L3 respectively. The length L2 of the second rail 30 and the length L3 of the third rail 32 are in this embodiment greater than the length L1 of the first rail 28 but are not necessarily so.

Figure 4:
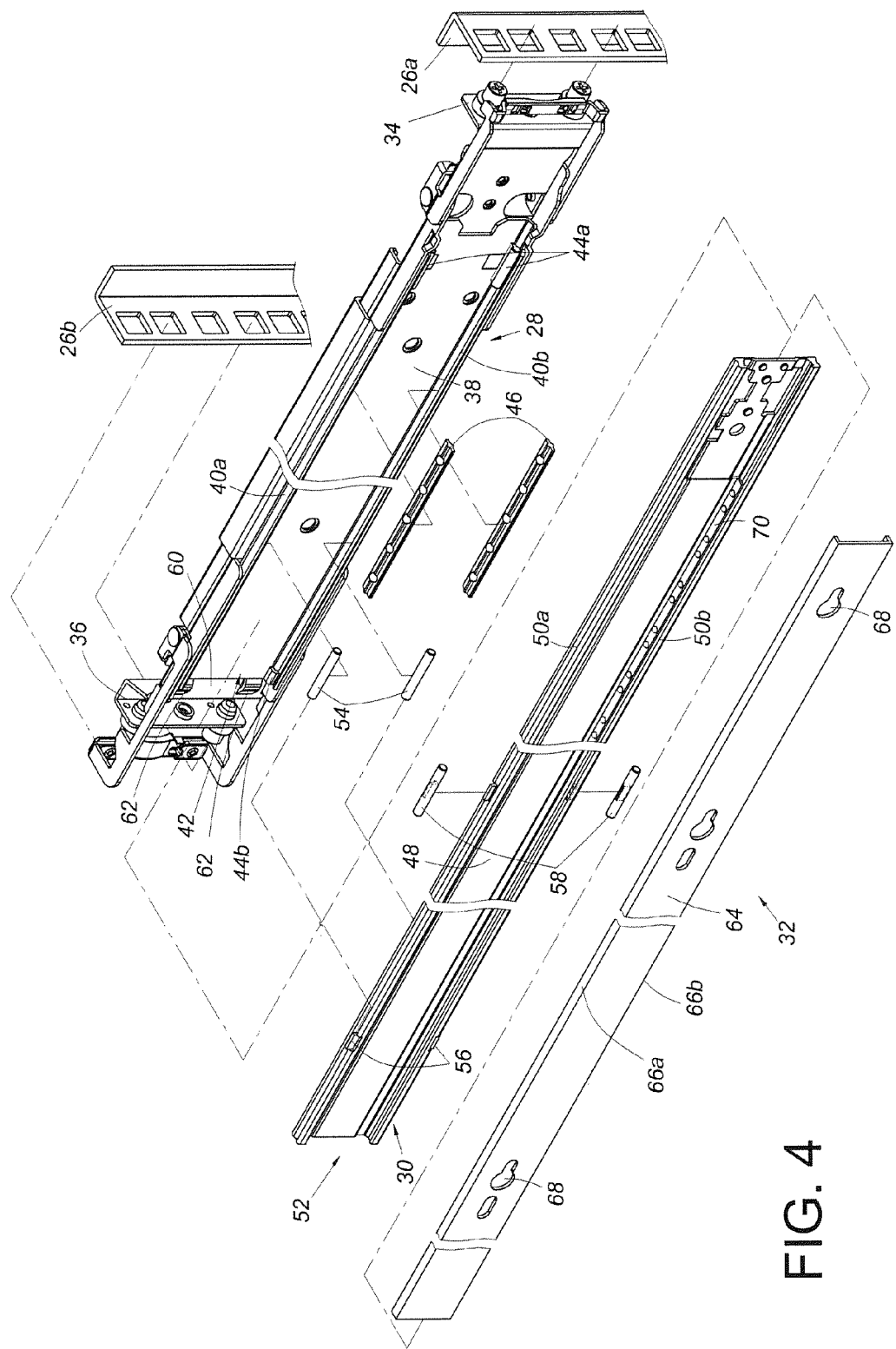
FIG. 4 is an exploded perspective view of the slide rail assembly in FIG. 3, wherein the first rail is to be mounted to the pair of posts via two brackets.

Referring to FIG. 3 and FIG. 4, the first rail 28 has two portions (e.g., a front portion and a rear portion) mounted to the first post 26a and the second post 26b via a first bracket 34 and a second bracket 36 respectively. The first post 26a and the second post 26b define an accommodation space S therebetween.

The first rail 28 includes a longitudinal wall 38, an upper wall 40a, and a lower wall 40b, wherein the upper wall 40a and the lower wall 40b are connected to two corresponding sides of the longitudinal wall 38 respectively. The longitudinal wall 38, the upper wall 40a, and the lower wall 40b jointly define a longitudinal channel 42. Preferably, at least one of the upper wall 40a and the lower wall 40b of the first rail 28 is provided with a front blocking portion 44a and a rear blocking portion 44b. In this embodiment, each of the upper wall 40a and the lower wall 40b is provided with the front blocking portion 44a and the rear blocking portion 44b (though only one of the rear blocking portions 44b is shown in FIG. 4 due to limitation of the viewing angle). The slide rail assembly 20 further includes at least one slide facilitating member 46 mounted between the front blocking portion 44a and the rear blocking portion 44b. The at least one slide facilitating member 46 allows the second rail 30 to displace relative to the first rail 28 with ease. For example, the at least one slide facilitating member 46 can be implemented as a pair of slide bars each provided with a plurality of balls or as a ball retainer provided with a plurality of balls. The present invention imposes no limitations on the configuration of the at least one slide facilitating member 46.

The second rail 30 is longitudinally movably connected to the first rail 28 and is located in the longitudinal channel 42 of the first rail 28. The second rail 30 includes a longitudinal wall 48, an upper wall 50a, and a lower wall 50b, wherein the upper wall 50a and the lower wall 50b are connected to two corresponding sides of the longitudinal wall 48 respectively. The longitudinal wall 48, the upper wall 50a, and the lower wall 50b jointly define a longitudinal channel 52. Preferably, the slide rail assembly 20 further includes at least one pair of support members 54 mounted between the first rail 28 and the second rail 30, a pair of pressing portions 56 provided at the upper wall 50a and the lower wall 50b of the second rail 30 respectively, and at least another pair of support members 58 connected to the upper wall 50a and the lower wall 50b of the second rail 30 in a fixed manner respectively. The pair of pressing portions 56 of the second rail 30 are configured to drive the at least one pair of support members 54, or the at least one pair of support members 54 can be driven by the second rail 30 due to the frictional contact therebetween. In addition, one of the first bracket 34 and the second bracket 36 (e.g., the second bracket 36) includes a sidewall 60. The sidewall 60 is adjacent to the channel opening of the longitudinal channel 42 of the first rail 28 and has at least one support portion 62, such as a pair of support portions 62. The pair of support portions 62 serve to support the longitudinal wall 48 of the second rail 30.

The third rail 32 is longitudinally movably connected to the second rail 30 and is located in the longitudinal channel 52 of the second rail 30. The third rail 32 includes a longitudinal wall 64, an upper wall 66a, and a lower wall 66b, wherein the upper wall 66a and the lower wall 66b are connected to two corresponding sides of the longitudinal wall 64 respectively. The longitudinal wall 64 of the third rail 32 further includes a plurality of mounting holes 68 via which the object 22 can be mounted to the third rail 32. Moreover, the slide rail assembly 20 includes another slide facilitating member 70, which is mounted between the second rail 30 and the third rail 32 to facilitate displacement of the third rail 32 relative to the second rail 30. In this embodiment, the slide facilitating member 70 is a ball retainer with a plurality of balls by way of example; the present invention imposes no limitations on the configuration of the slide facilitating member 70.

Figure 5:
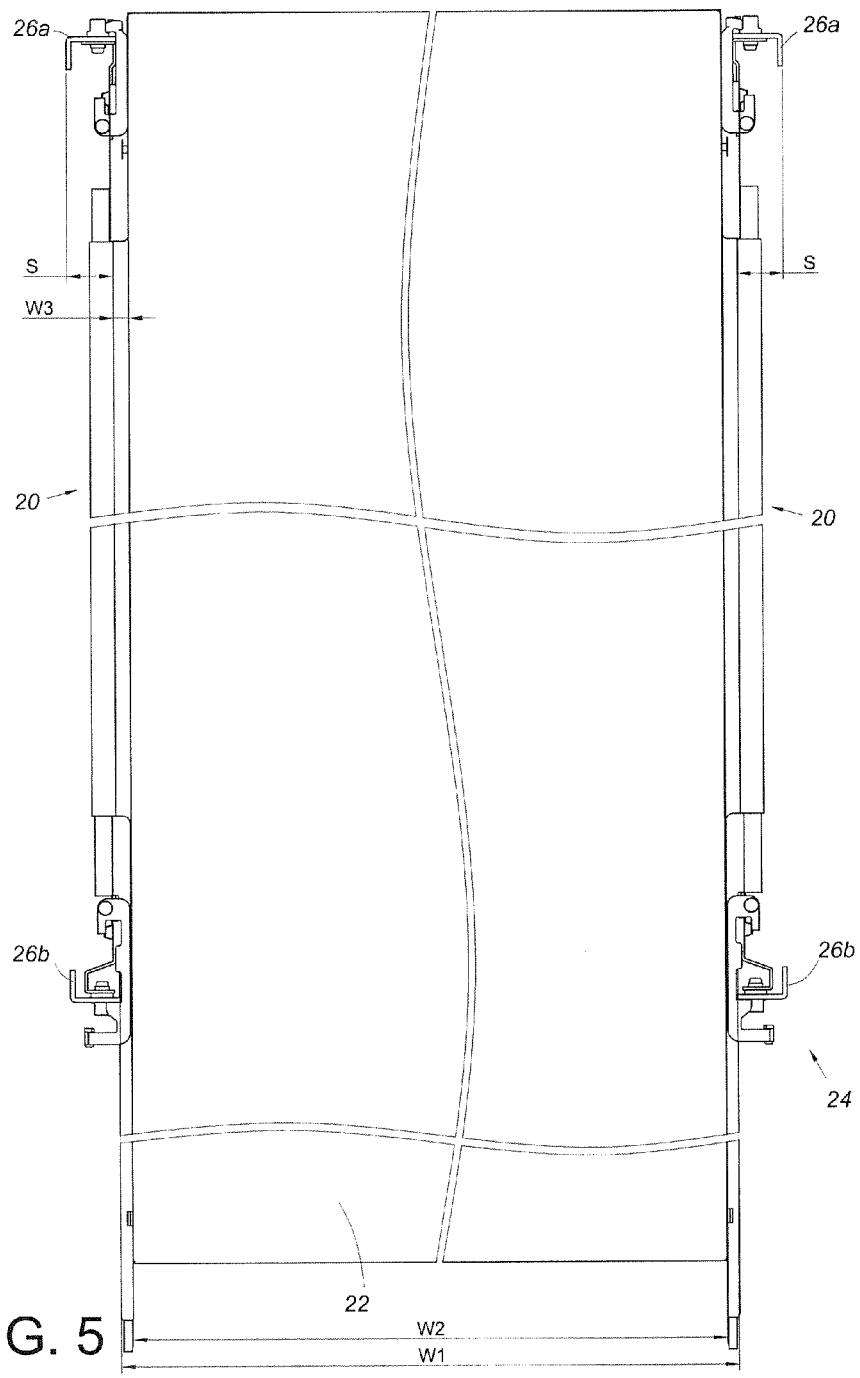
FIG. 5 is a schematic version of FIG. 2, showing how the pair of slide rail assemblies are used to mount the object to the rack.

Referring to FIG. 5, the two corresponding lateral sides of the object 22 are each mounted to the corresponding first post 26a and the corresponding second post 26b by one slide rail assembly 20. A first transverse width W1 is defined between the inner sides of the two pair of posts, which are located on two lateral sides of the object 22 respectively. More specifically, the inner sides of the two first posts 26a are spaced apart by the first transverse width W1, and so are the inner sides of the two second posts 26b. The object 22, on the other hand, has a second transverse width W2 while the cross section of each slide rail assembly 20 includes a third transverse width W3.

The specifications of the rack 24 conform to those established by the Electronic Industries Alliance (EIA), so if the second transverse width W2 of the object 22 is very close to the first transverse width W1 of the rack 24, either the structure or the mounting method of the slide rail assemblies must be modified in order to ensure that the object 22 can be smoothly retracted into the rack 24 and/or pulled out of the rack 24 for maintenance or replacement.

Figure 6:
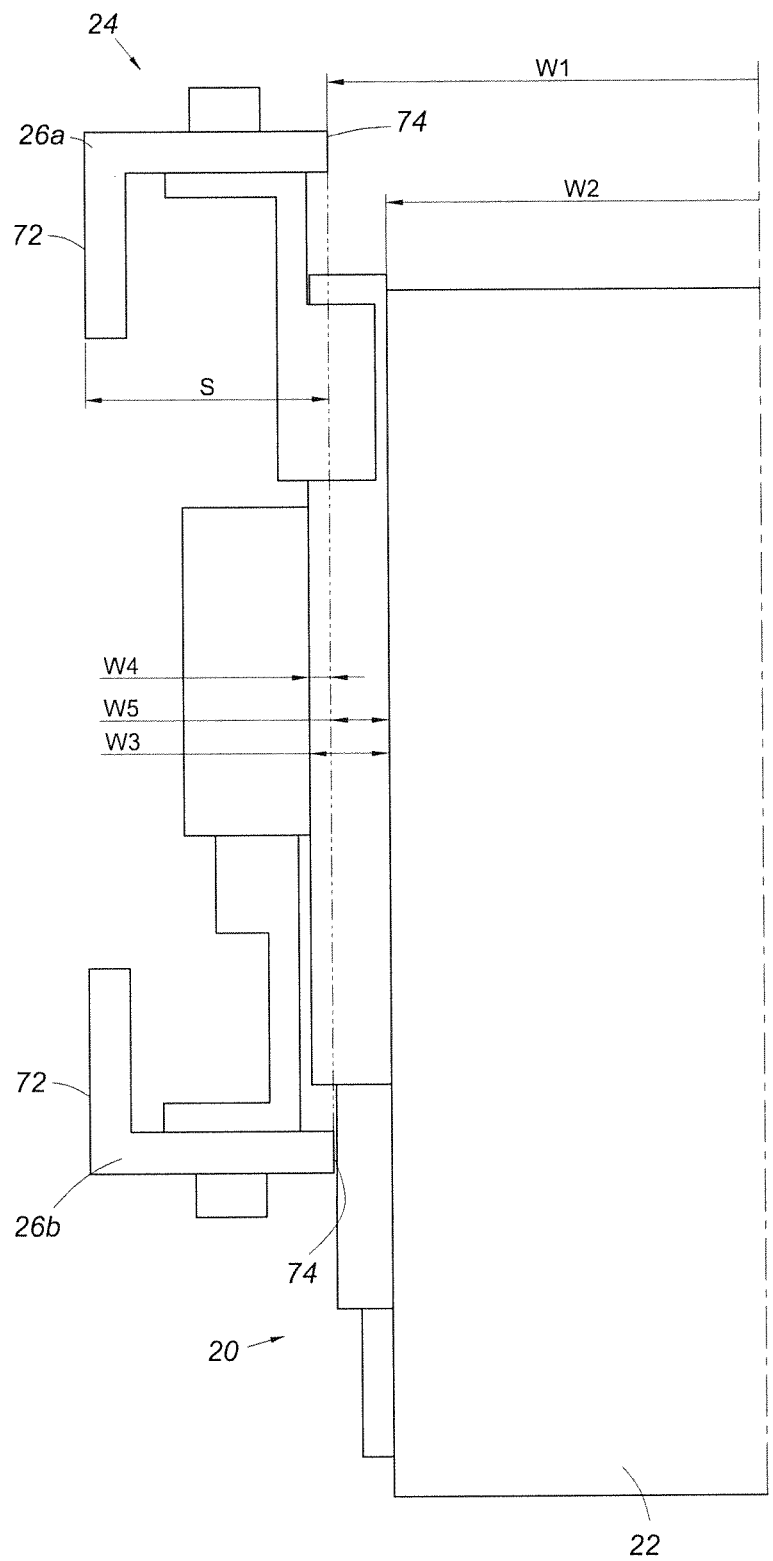
FIG. 6 is another schematic version of FIG. 2, showing how one of the slide rail assemblies is mounted between two posts and how a portion of the width of the slide rail assembly is arranged within an accommodation space between the two posts.

To address the foregoing issue, referring to FIG. 5 and FIG. 6, each slide rail assembly 20 in this embodiment is so designed that a portion (i.e., partial width W4) of the third transverse width W3 is arranged within the accommodation space S between the corresponding first post 26a and second post 26b while the remainder (i.e., partial width W5) of the third transverse width W3 is arranged within the rack 24. Due to the arrangement of the partial width W5 of the third transverse width W3 of each slide rail assembly 20, the object 22 can be mounted between a pair of first posts 26a and a pair of second posts 26b and lie within the space defined by the first transverse width W1 of the rack 24, without having to change the structural support conditions. More specifically, referring to FIG. 6, each second post 26b as well as each first post 26a has a first side 72 (e.g., outer side) and a second side 74 (e.g., inner side) opposite the first side 72, and the accommodation space S, within which the partial width W4 of the third transverse width W3 of the slide rail assembly 20 is arranged, is defined between a longitudinal extension between the two first sides 72 and a longitudinal extension between the two second sides 74.

Figure 7B:
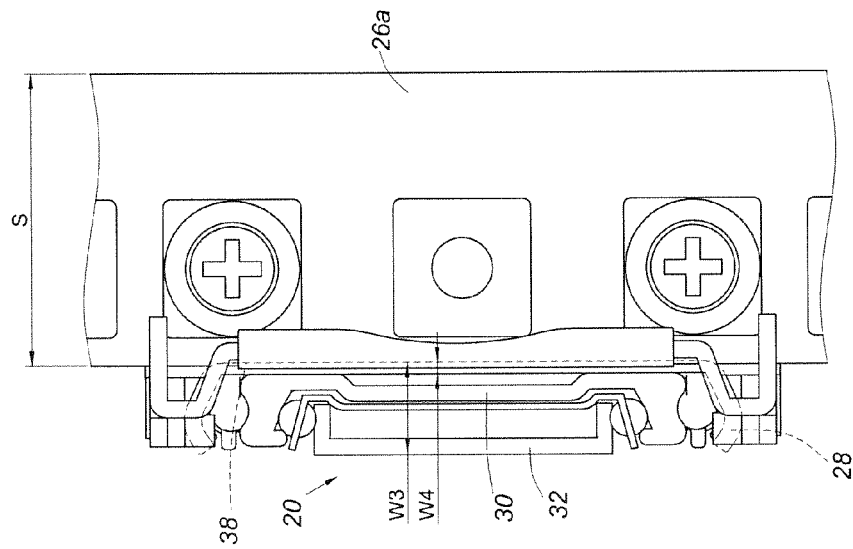
FIG. 7B is a schematic drawing of the slide rail assembly in FIG. 7A as viewed from a different viewing angle, showing how a portion of the width of the first rail is arranged within the accommodation space.
Figure 7A:
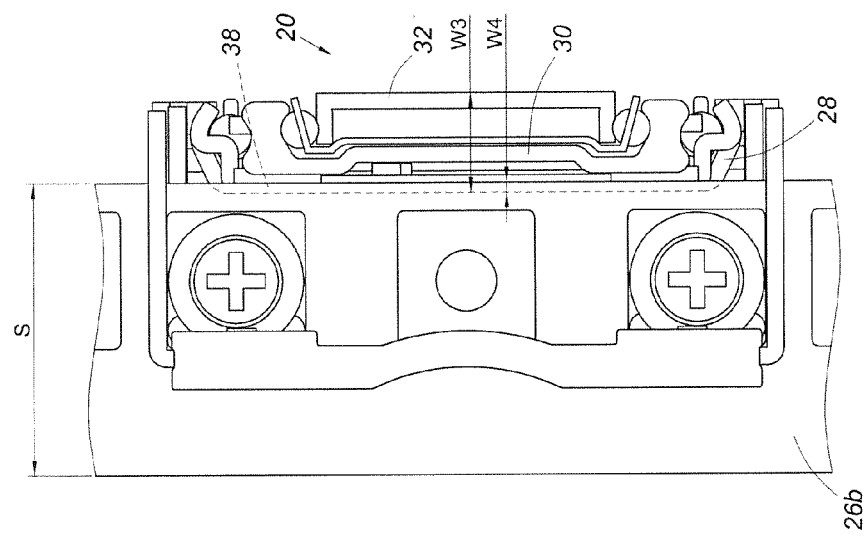
FIG. 7A schematically shows how a portion of the width of the first rail of the slide rail assembly in FIG. 3 is arranged within the accommodation space.

As shown in FIG. 7A and FIG. 7B, the slide rail assembly 20 includes the first rail 28, the second rail 30, and the third rail 32. When the slide rail assembly 20 is mounted on the first post 26a and the second post 26b, the partial width W4 of the third transverse width W3 of the slide rail assembly 20 is arranged within the accommodation space S between the first post 26a and the second post 26b. In this embodiment, the partial width W4 is the width of at least a portion of the longitudinal wall 38 of the first rail 28 by way of example. Simply put, at least a portion of the longitudinal wall 38 of the first rail 28 is hidden in the accommodation space S such that the width of the cross section of this portion of the longitudinal wall 38 is excluded from and does not occupy the space defined by the first transverse width W1 inside the rack 24.

Figure 8A:
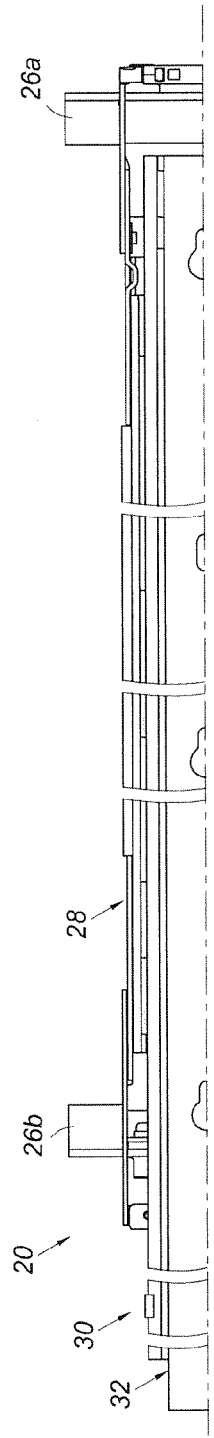
FIG. 8A is a schematic drawing of the slide rail assembly in FIG. 3 and shows the slide rail assembly mounted between a pair of posts, wherein both the second rail and the third rail are in a retracted state relative to the first rail.
Figure 8B:
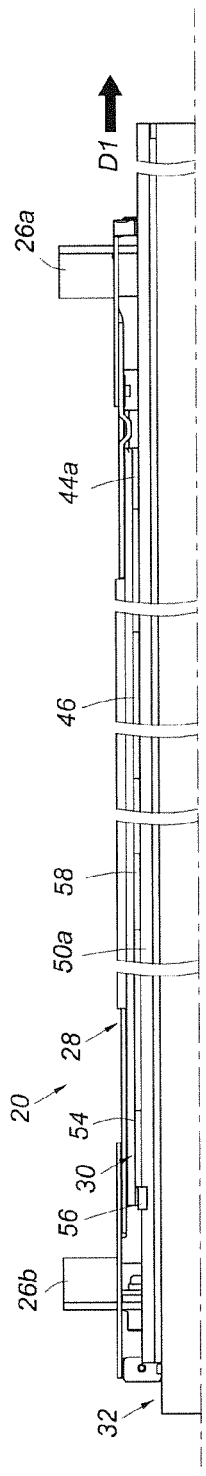
FIG. 8B schematically shows how the second rail and the third rail of the slide rail assembly in FIG. 8A are separately displaced relative to the first rail in an extension direction, how the second rail is displaced with the assistance of at least one slide facilitating member, and how at least two sections of the second rail are supported by at least two pairs of support members respectively.
Figure 8C:
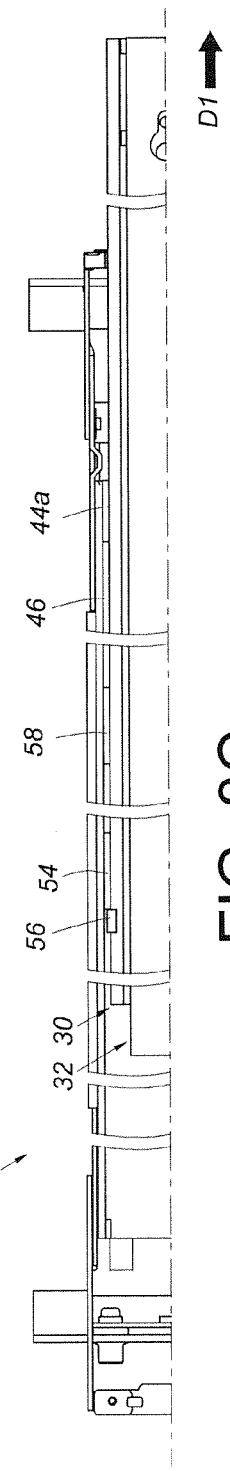
FIG. 8C schematically shows how the second rail and the third rail of the slide rail assembly in FIG. 8B are further separately displaced relative to the first rail in the extension direction.
Figure 9:
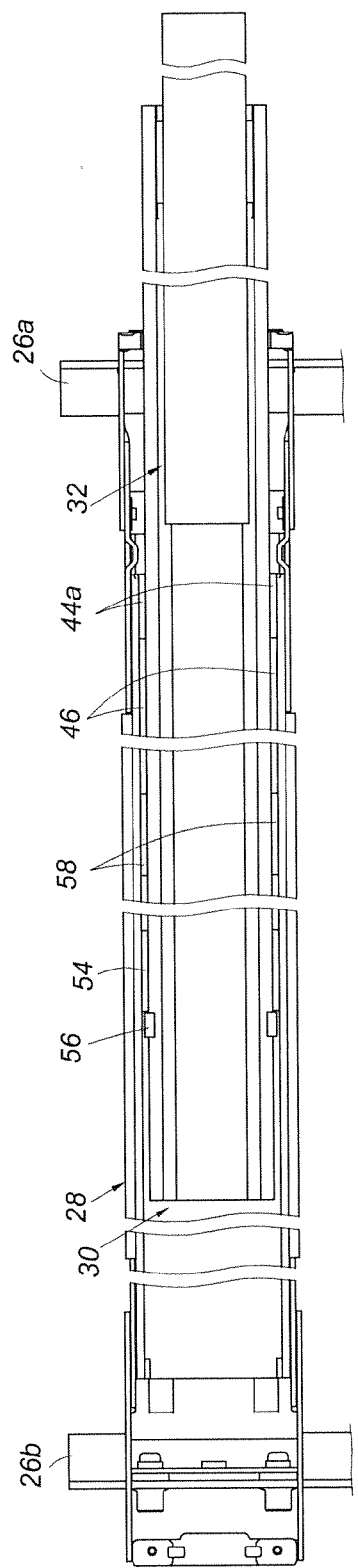
FIG. 9 is a schematic drawing of the slide rail assembly in FIG. 3 and shows the slide rail assembly mounted between a pair of posts, wherein both the second rail and the third rail are in an extended state relative to the first rail.

Referring to FIG. 8A, FIG. 8B, and FIG. 8C, the slide rail assembly 20 is mounted between the first post 26a and the second post 26b, and the second rail 30 and the third rail 32 can be separately displaced relative to the first rail 28 in an extension direction D1 from a retracted position in order to bring the slide rail assembly 20 into an extended state. More specifically, in the course in which the third rail 32 and the second rail 30 are displaced relative to the first rail 28 in the extension direction D1, the at least one slide facilitating member 46 allows the second rail 30 to be easily displaced relative to the first rail 28, and the pair of pressing portions 56 (only one of which is shown in FIG. 8A through FIG. 8C) can drive the at least one pair of support members 54 (only one of which is shown in FIG. 8A through FIG. 8C) while the second rail 30 is displaced in order for the at least one pair of support members 54 to movably support the upper wall 50a and the lower wall 50b (not shown) of a section of the second rail 30. On the other hand, as the at least another pair of support members 58 (only one of which is shown in FIG. 8A through FIG. 8C) are fixedly connected to the second rail 30 and are therefore displaced relative to the first rail 28 along with the second rail 30, the upper wall 50a and the lower wall 50b (not shown) of another section of the second rail 30 are also supported relative to the first rail 28 via the at least another pair of support members 58. Thus, even if the second rail 30 has a greater length than the first rail 28, the need to support an additional section of the second rail 30 (e.g., a rear section of the second rail 30) while the second rail 30 is displaced relative to the first rail 28 will be satisfied. When the second rail 30 is in an extended state as shown in FIG. 8C, the slide facilitating member 46 is blocked by the front blocking portion 44a of the first rail 28 and consequently blocks the at least another pair of support members 58.

With reference to FIG. 9, FIG. 10, FIG. 10A, and FIG. 10B, once the second rail 30 and the third rail 32 are each displaced relative to the first rail 28 to an extended position and are therefore in an extended state, the slide facilitating member 46 is blocked by the front blocking portion 44a of the first rail 28, and the at least another pair of support members 58 are blocked by the slide facilitating member 46. Moreover, the pair of pressing portions 56 of the second rail 30 have driven the at least one pair of support members 54 to a certain position.

Figure 11A:
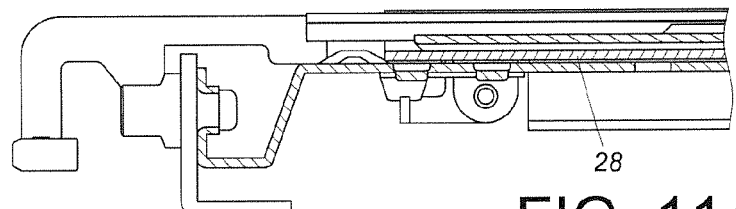
FIG. 11A is a schematic drawing of the slide rail assembly in FIG. 3, showing that each of the second rail and the third rail is at a certain position relative to the first rail.
Figure 11B:
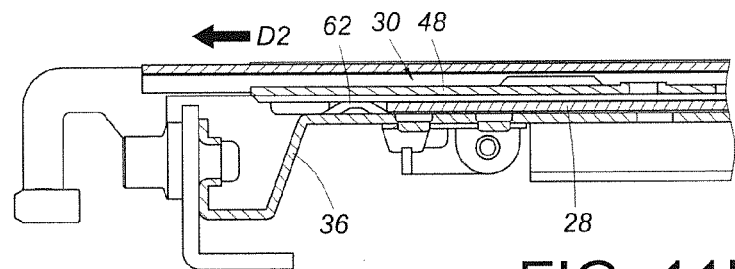
FIG. 11B schematically shows how the second rail of the slide rail assembly in FIG. 11A is supported by the at least one support portion of a bracket when the second rail and the third rail of the slide rail assembly are displaced relative to the first rail in a certain direction.
Figure 11C:
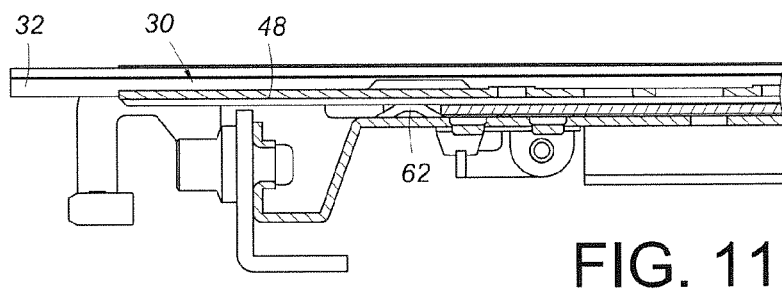
FIG. 11C schematically shows how the second rail and the third rail of the slide rail assembly in FIG. 11B are further displaced relative to the first rail in that direction.

Referring to FIG. 11A, FIG. 11B, and FIG. 11C, when the second rail 30 is displaced relative to the first rail 28 in a certain direction (e.g., a retraction direction D2 or the aforesaid extension direction D1) to move past the pair of support portions 62 (only one of which is shown in FIG. 11A through FIG. 11C) of the second bracket 36, the pair of support portions 62 provide support for the longitudinal wall 48 of the second rail 30 so that the second rail 30 can be displaced relative to the first rail 28 stably.

Figure 12:
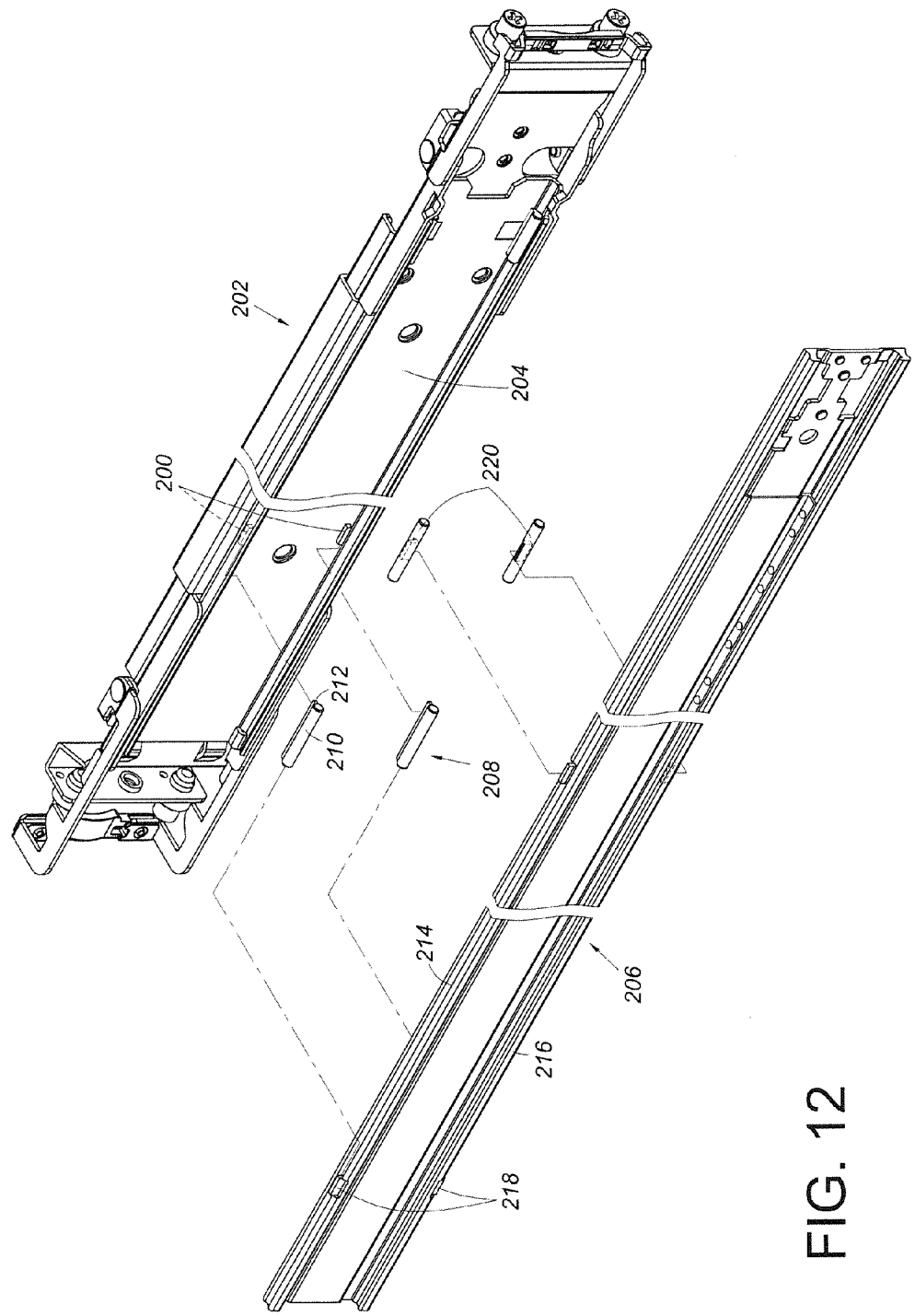
FIG. 12 is an exploded perspective view of the slide rail assembly in another embodiment of the present invention, wherein the first rail includes blocking portions for blocking the support members mounted between the first rail and the second rail.

FIG. 12 shows the slide rail assembly in another embodiment of the present invention. More specifically, the slide rail assembly in this embodiment further includes a pair of blocking portions 200, which can be provided at the first rail 202. For example, the pair of blocking portions 200 are provided at the longitudinal wall 204 of the first rail 202, and yet the present invention imposes no limitations on the location of the pair of blocking portions 200. The at least one pair of support members 208 mounted between the first rail 202 and the second rail 206 may correspond to the pair of blocking portions 200.

Figure 13:
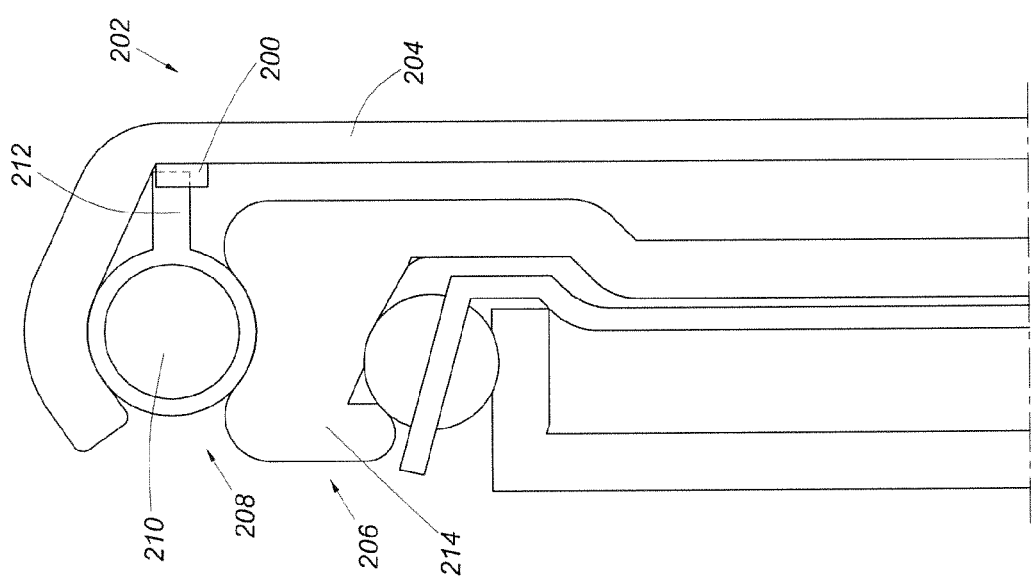
FIG. 13 is a partial assembled schematic view of the slide rail assembly in FIG. 12, showing in particular how a support member mounted between the first rail and the second rail is blocked by a blocking portion.

Referring also to FIG. 13, each support member 208 between the first rail 202 and the second rail 206 further includes a longitudinal portion 210 and a contact portion 212, wherein the contact portion 212 is transversely connected to the longitudinal portion 210 and faces the longitudinal wall 204 of the first rail 202. For example, the longitudinal portions 210 of the two support members 208 correspond respectively to the upper wall 214 and the lower wall 216 of the second rail 206, and the contact portion 212 of each support member 208 can be blocked by one of the pair of blocking portions 200.

In FIG. 14A, the second rail 206 is at a retracted position relative to the first rail 202.

In FIG. 14B, FIG. 14C, and FIG. 14D, the second rail 206 is displaced relative to the first rail 202 in an extension direction D3 from the retracted position. During the process, the at least one pair of support members 208 are driven by the second rail 206 due to the frictional contact therebetween, but when the contact portions 212 of the at least one pair of support members 208 are blocked by the pair of blocking portions 200 respectively, the at least one pair of support members 208 are retained at a predetermined position P1 (see FIG. 14B). In this state, the second rail 206 can be further displaced relative to the first rail 202 in the extension direction D3 until a second predetermined position P2 is reached (see FIG. 14C) or until a third predetermined position P3 is reached (see FIG. 14D, in which the second rail 206 is fully extended by way of example), and whether the second rail 206 is at the second predetermined position P2 or the third predetermined position P3, the upper wall 214 and the lower wall 216 (see FIG. 12) of a rear section of the second rail 206 relative to the first rail 202 will be supported by the at least one pair of support members 208. It is worth mentioning that the pressing portions 218 are in contact with the at least one pair of support members 208 respectively when the second rail 206 is at the third predetermined position P3, and that the at least another pair of support members 220 connected to the upper wall 214 and the lower wall 216 of the second rail 206 in a fixed manner respectively are offset with respect to the pair of blocking portions 200 and therefore can move past the pair of blocking portions 200 while the second rail 206 is displaced relative to the first rail 202. The at least another pair of support members 220 serve to support the upper wall 214 and the lower wall 216 of another section of the second rail 206.

While the present invention has been disclosed through the foregoing embodiments, the embodiments are not intended to be restrictive of the present invention. The scope of patent protection sought by the applicant is defined solely by the appended claims.

The invention claimed is:

1. A slide rail assembly adapted to be mounted to a first post and a second post, wherein the first post and the second post are positioned to define an accommodation space therebetween, the slide rail assembly comprising:
   a first rail mounted to the first post and the second post via a first bracket and a second bracket respectively, the first rail thereby being located between the first post and the second post, the first rail including a longitudinal wall, an upper wall, and a lower wall, wherein the upper wall and the lower wall are connected to two corresponding sides of the longitudinal wall of the first rail respectively;
   wherein at least a portion of the longitudinal wall is arranged within the accommodation space, and the longitudinal wall, the upper wall, and the lower wall jointly define a longitudinal channel;
   a second rail longitudinally and movably connected to the first rail and located in the longitudinal channel of the first rail;
   at least a first pair of support members mounted between the first rail and the second rail, the second rail including a longitudinal wall, an upper wall, and a lower wall, wherein the upper wall and the lower wall are connected to two corresponding sides of the longitudinal wall respectively, and the first pair of support members support the upper wall and the lower wall of a section of the second rail respectively when the second rail is displaced relative to the first rail; and
   a pair of pressing portions provided at the upper wall and the lower wall of the second rail respectively, wherein the pair of pressing portions drive the first pair of support members when the second rail is displaced relative to the first rail in an extension direction from a retracted position.

2. The slide rail assembly of claim 1, wherein one of the upper wall and the lower wall of the first rail includes a front blocking portion and a rear blocking portion, and the slide rail assembly further comprising at least one slide facilitating member mounted between the front blocking portion and the rear blocking portion to facilitate displacement of the second rail relative to the first rail.

3. The slide rail assembly of claim 1, further comprising at least a second pair of support members respectively and fixedly connected to the upper wall and the lower wall of the second rail, the upper wall and the lower wall of another section of the second rail thereby being supported relative to the first rail.

4. The slide rail assembly of claim 1, wherein the first rail has a first length, and the second rail has a second length greater than the first length of the first rail.

5. The slide rail assembly of claim 1, wherein one of the first bracket and the second bracket further includes a sidewall having at least one support portion for supporting the second rail when the second rail is displaced relative to the first rail to move past the at least one support portion.

6. A slide rail assembly applicable to an object to be supported, wherein the object is to be mounted to a rack by a pair of said slide rail assemblies, the rack includes two pairs of posts, the two pairs of posts define a transverse width therebetween, each said pair of posts includes a first post and a second post substantially corresponding in position to the first post, each said second post and each said first post have a first side and a second side opposite the first side, and an accommodation space is defined by each said pair of posts as a longitudinal extension between the two first sides and a longitudinal extension between the two second sides, each said slide rail assembly comprising:
   a first rail mounted to the first post and the second post of a corresponding said pair of posts via a first bracket and a second bracket respectively, the first rail thereby being located between the first post and the second post;
   a second rail longitudinally and movably connected to the first rail; the second rail including a longitudinal wall, an upper wall, and a lower wall, wherein the upper wall and the lower wall are connected to two corresponding sides of the longitudinal wall respectively,
   at least a pair of support members mounted between the first rail and the second rail, wherein the pair of support members support the upper wall and the lower wall of a section of the second rail respectively when the second rail is displaced relative to the first rail;
   a pair of pressing portions provided at the upper wall and the lower wall of the second rail respectively, wherein the pair of pressing portions drive the pair of support members when the second rail is displaced relative to the first rail in an extension direction from a retracted position; and
   a third rail longitudinally and movably connected to the second rail and configured to be mounted with the object;
   wherein each said slide rail assembly includes a transverse width, and a portion of the transverse width of each said slide rail assembly is arranged within the accommodation space defined by the corresponding pair of posts.

7. The slide rail assembly of claim 6, wherein the first rail of each said slide rail assembly further includes a longitudinal wall, and the portion of the transverse width of each said slide rail assembly includes at least a portion of a width of the longitudinal wall of the first rail.

8. A slide rail assembly, comprising:
   a first rail including a longitudinal wall, an upper wall, and a lower wall, wherein the upper wall and the lower wall are connected to two corresponding sides of the longitudinal wall of the first rail respectively, and the longitudinal wall, the upper wall, and the lower wall jointly define a longitudinal channel;
   a second rail longitudinally and movably connected to the first rail and located in the longitudinal channel of the first rail, the second rail including a longitudinal wall, an upper wall, and a lower wall, wherein the upper wall and the lower wall are connected to two corresponding sides of the longitudinal wall of the second rail respectively;

at least a first pair of support members mounted between the first rail and the second rail;

wherein when the second rail is displaced relative to the first rail, the first pair of support members are displaced along with the second rail and support the upper wall and the lower wall of a section of the second rail; and a pair of pressing portions provided at the upper wall and the lower wall of the second rail respectively, wherein the pair of pressing portions drive the first pair of support members when the second rail is displaced relative to the first rail in an extension direction from a retracted position.

9. The slide rail assembly of claim 8, further comprising at least a second pair of support members respectively and fixedly connected to the upper wall and the lower wall of the second rail, the upper wall and the lower wall of another section of the second rail thereby being supported relative to the first rail.

10. The slide rail assembly of claim 8, wherein one of the upper wall and the lower wall of the first rail includes a front blocking portion and a rear blocking portion, and the slide rail assembly further comprising at least one slide facilitating member mounted between the front blocking portion and the rear blocking portion to facilitate displacement of the second rail relative to the first rail.

11. The slide rail assembly of claim 8, wherein the first rail has a first length, and the second rail has a second length greater than the first length of the first rail.

12. The slide rail assembly of claim 8, further comprising a third rail longitudinally and movably connected to the second rail.

13. The slide rail assembly of claim 12, wherein the first rail has a first length, and the third rail has a third length greater than the first length of the first rail.

* * * * *